(12) United States Patent
Bucska

(10) Patent No.: US 6,725,245 B2
(45) Date of Patent: Apr. 20, 2004

(54) HIGH SPEED PROGRAMMABLE COUNTER ARCHITECTURE

(75) Inventor: Nicholas J. Bucska, Longmont, CO (US)

(73) Assignee: P.C. Peripherals, Inc, Broomfield, CO (US)

( * ) Notice: Subject to any disclaimer, the term of this patent is extended or adjusted under 35 U.S.C. 154(b) by 46 days.

(21) Appl. No.: 10/138,204

(22) Filed: May 3, 2002

(65) Prior Publication Data

US 2003/0208513 A1 Nov. 6, 2003

(51) Int. Cl.$^7$ ............................................. G06F 17/68
(52) U.S. Cl. ....................................................... 708/103
(58) Field of Search ............................ 708/103; 377/52

(56) References Cited

U.S. PATENT DOCUMENTS

| 2,632,058 A | 3/1953 | Gray | 179/15 |
|---|---|---|---|
| 3,849,635 A | 11/1974 | Freedman | 235/92 |
| 4,053,739 A | 10/1977 | Miller et al. | 364/703 |
| 4,084,082 A | 4/1978 | Alfke | 235/92 |
| 4,158,767 A | 6/1979 | Long | 235/92 |
| 4,184,068 A | 1/1980 | Washburn | 235/92 |
| 4,325,031 A | 4/1982 | Ooms et al. | 331/1 |
| 4,477,920 A | 10/1984 | Nygaard, Jr. | 377/52 |
| 4,545,063 A | 10/1985 | Kamimaru | 377/52 |
| 4,975,931 A | 12/1990 | Cosand | 377/52 |
| 4,991,187 A | 2/1991 | Herold et al. | 377/48 |
| 5,142,651 A | 8/1992 | Cronyn | 377/44 |
| 5,206,547 A | 4/1993 | Houghten et al. | 307/465 |
| 5,313,509 A | 5/1994 | Tomita | 377/44 |
| 5,373,542 A | 12/1994 | Sunouchi | 377/44 |
| 6,035,182 A | * 3/2000 | Shurboff | 455/216 |
| 6,066,990 A | * 5/2000 | Genest | 331/25 |
| 6,097,782 A | * 8/2000 | Foroudi | 377/47 |

* cited by examiner

*Primary Examiner*—David H. Malzahn
(74) *Attorney, Agent, or Firm*—Sheridan Ross P.C.

(57) ABSTRACT

A high speed programmable counter architecture is disclosed. In accordance with an embodiment of the present invention, the high speed programmable counter includes an n bit high speed prescaler and an m bit low speed counter. An input signal can be divided by any value equal to or greater than $j*2^n$. The modulus of division can be provided to the programmable counter in binary form directly, without requiring complex calculations or decoding circuitry. The present invention allows high speed programmable counters to be provided that are capable of dividing by much smaller numbers than conventional counters, including numbers less than $2^{n}*(2^{n}-1)$, wherein n is equal to the number of bits in a high speed prescaler.

17 Claims, 8 Drawing Sheets

HIGH SPEED PROGRAMMABLE COUNTER ARCHITECTURE

FIELD OF THE INVENTION

The present invention relates to an architecture for providing a high speed programmable counter. In particular, the present invention relates to a high speed counter that can be programmed to divide by a wide range of values.

BACKGROUND OF THE INVENTION

Programmable counters are used in a variety of electronic devices. In one application, programmable counters are used as frequency dividers, in which an output of the programmable counter is a periodic signal having a frequency equal to some fraction of the frequency of the input signal. However, the value by which an input signal can be divided is limited when existing high speed programmable counters are used.

Binary counters formed from multiple stages in which each stage divides by a power of two are known. In addition, binary counters capable of dividing by any desired number are known. However, the maximum speed of such counters is severely limited.

In order to provide a higher speed counter, it is possible to use a high speed prescaler that divides the input frequency by a fixed number, usually a power of two. However, in such a counter, the modulus that the counter may divide by is limited to multiples of the prescaler value.

Still another approach is to use a dual modulus prescaler followed by a lower speed counter stage. In such an arrangement, illustrated in FIG. 1, the high speed counter 100 consists of a high frequency, dual modulus prescaler 104, a low frequency programmable counter, connected as a single shot 108, and a low frequency programmable counter 112. The high speed counter 100 in FIG. 1 receives a high frequency input signal 116 at an input to the high frequency prescaler 104. An output 120 of the prescaler 104 is asserted for every $n^{th}$ or $(n+1)^{th}$ cycles of the input 116. The low frequency clock output 120 is provided to both the single shot 108 and the programmable counter 112. A carry output 124 is generated by the programmable counter 112 for every $m^{th}$ clock cycle received from the low speed output 120 of the prescaler 104. The output 128 of the single shot 108 is provided to the modulus control input 132 of the prescaler 104 to control whether the prescaler 104 divides by n or n+1.

The high speed counter 100 illustrated in FIG. 1 is limited in the moduli by which the counter can divide. That is, in a circuit 100 using a prescaler 104 that can divide by either n or n+1, the modulus can have only certain values below $n*(n-1)$. In particular, in a prescaler that comprises a dual modulus counter, with the moduli n and n+1, one period of the low speed counter can be extended by only one high speed clock cycle. Therefore, the low speed counter 112 must have at least R periods in order to accommodate every possible remainder up to the value of R. This sets the lower limit of the possible contiguous moduli to $n*(n-1)$. For example, a high speed counter 100 using an 8/9 prescaler 104 can divide by 16, 17 or 18 if the low frequency programmable counter 112 is programmed to divide by 2. The counter 100 can also be programmed to divide by 24, 25, 26, 27, 32, 33, 34, 35, 36, 40, 41, 42, 43, 44, 45 etc.

Only after 55 can a counter 100 using an 8/9 prescaler divide by any value. Accordingly, existing high speed counters have been limited in their applications.

In addition, relatively complicated calculations must be performed in order to determine how many times the prescaler must count to n and how many times it must count to n+1 to achieve the desired modulus of division. For example, to divide an input signal by i=1111 using an n=32/33 prescaler, the following calculations are performed:

$M$=integer part of $i/n$=$int$(1111/32)=34

$R$=$i$−$n*M$=1111−34*32=23

$J$=$M$−$R$=34−23=11

So $i$=$R*(n+1)$+$J*n$

Or 1111=23*33+11*32.

The above calculations indicate that a prior art counter using a dual modulus prescaler must be programmed to count 23 times to 33, and to count 11 times to 32. Accordingly, the counter 112 will be programmed to divide the low frequency clock output 120 by 34, and the single shot 108 will generate a positive pulse for 11 of the output pulses.

For the above stated reasons, it would be advantageous to provide a high speed counter capable of dividing by relatively small moduli. In addition, it would be advantageous to provide such a counter that was easy to program.

SUMMARY OF THE INVENTION

In accordance with the present invention, a method and apparatus for providing a high speed programmable counter is disclosed. The present invention generally allows an input signal to be divided by any number greater than or equal to $J*2^n$, where n is the number of bits of a high speed prescaler provided as part of the high speed counter and J is a small number, e.g. 1 or 2. In addition, the present invention allows the modulus of division to be directly loaded into the counter.

According to one embodiment of the present invention, the high speed programmable counter comprises a programmable high speed prescaler followed by a programmable low speed counter. In particular, the programmable high speed prescaler receives a signal having a frequency to be divided, and outputs a low frequency output. The low speed counter receives the low frequency output, and generates a counter output signal having a frequency equal to the input frequency divided by the modulus of division and a control signal. The value by which the high speed prescaler divides the input signal is determined by the n least significant bits of the modulus of division. The value by which the low speed counter divides the signal received from the high speed counter is determined by the m most significant bits of the modulus of division.

Generally, a counter according to an embodiment of the present invention consists of a low speed counter and a high speed prescaler. The low speed m bit counter has m data bit inputs, one clock input, one load input and one CARRY output which divides the clock input by the number represented in binary form by the m most significant bits of the i modulus. This counter is preceded by a high speed multi-modulus counter, a prescaler, with n data bit inputs, one clock input, one trigger input and one output, where the n bits are the least significant bits of the i modulus. The low speed counter is reloaded by its own CARRY output and is clocked by the high speed clock divided by the prescaler (i.e. by the output of the high speed prescaler). The modulus of the prescaler is at least $2^n$ and at most $2^n+2^n-1$, where the $2^n-1$ is equal to the maximum number defined by the n bits and which is also equal to the remainder R defined by the equation $$R=i-n*m.$$

In accordance with an embodiment of the present invention, the high speed prescaler can be programmed to produce one output pulse for from every $2^n$ to every $2^n+(2^n-1)$ cycles of the signal to be divided. In accordance with a further embodiment of the present invention, the high speed prescaler is formed from 2n D flip-flops and n NAND gates.

In accordance with another embodiment of the present invention, a method for implementing a high speed programmable counter is provided. According to the method, the m most significant bits of an m+n bit databus carrying a value equal to the modulus of division of the counter are provided to the low speed counter.

In accordance with the present invention, the high speed prescaler is a multi-modulus counter that can be programmed to produce one output pulse for from every $2^n$ to every $2^n+(2^n-1)$ cycles of the signal to be divided, so that $J*2^n$ is the lowest possible limit, where J is any integer value greater than zero, including a low number like 2 or even 1.

In accordance with another embodiment of the present invention, the m most significant bits of an m+n bit databus carrying a value equal to the desired modulus of division are provided to the low speed counter. The m most significant bits establish a starting count value for the low speed counter. The n least significant bits of the m+n bit databus are provided to a high speed prescaler. The method according to this embodiment of the present invention allows the high speed programmable counter to divide by any number greater than a low multiple of $2^n$. According to another embodiment of the present invention, the modulus of division may be any number equal to or greater than 1. Furthermore, this method allows the modulus of division to be loaded into the high speed programmable counter in binary form, without requiring ancillary calculations.

Additional advantages of the present invention will become readily apparent from the following discussion, particularly when taken together with accompanying drawings.

DETAILED DESCRIPTION

In accordance with the present invention, a high speed programmable counter architecture is provided.

Figure 1:
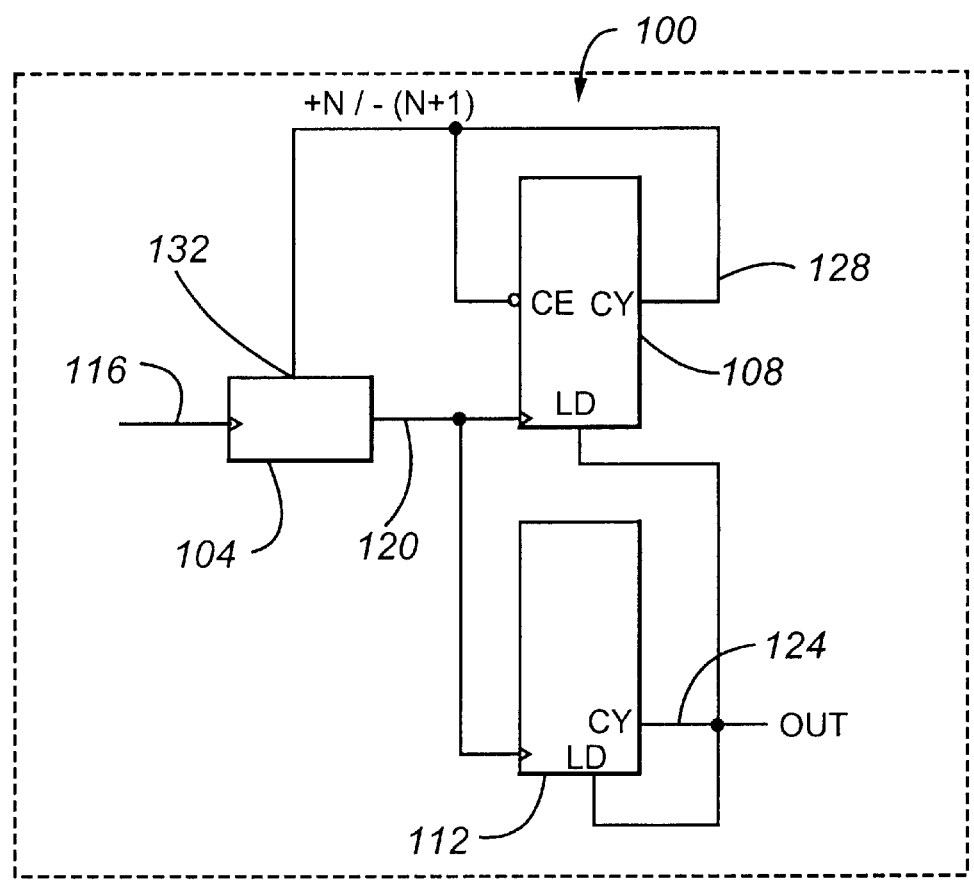
FIG. 1 is a block diagram illustrating a high speed programmable counter in accordance with the prior art.
Figure 2:
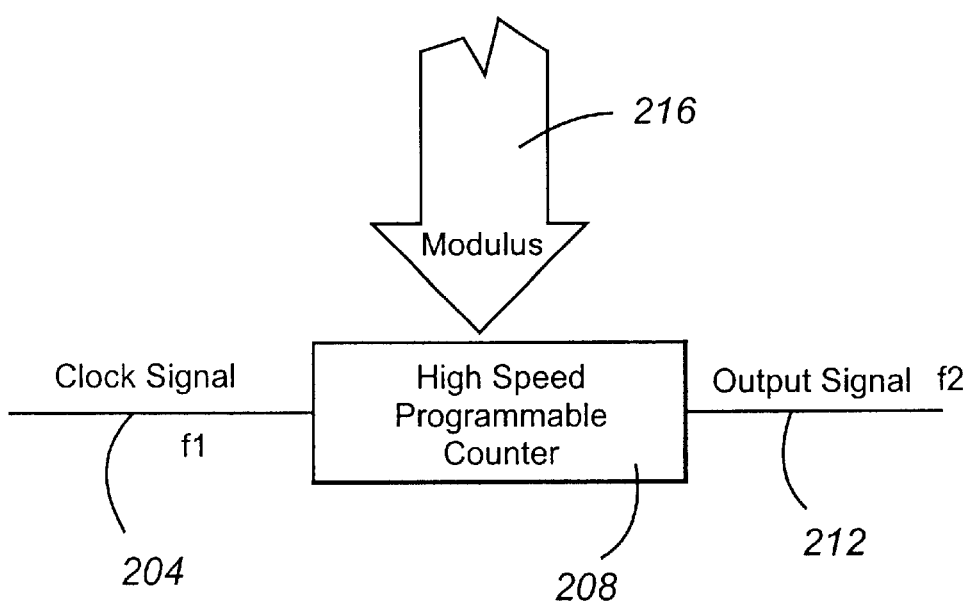
FIG. 2 is a block diagram illustrating a frequency dividing circuit in accordance with an embodiment of the present invention.

With reference now to FIG. 2, a top level block diagram of a frequency divider system 200 is illustrated. A clock signal having a frequency $f_1$ 204 is provided to a high speed programmable counter 208. The programmable counter 208, in response to the clock signal 204, produces an output signal having a frequency $f_2$ 212. The output frequency $f_2$ 212 is a fraction of the input frequency $f_1$. In particular, the programmable counter 208 divides the clock signal 204 by a modulus of division 216 provided to the programmable counter 208. In accordance with an embodiment of the present invention, the modulus of division 216 may be provided to the programmable counter 208 directly in binary form. Accordingly, programmable counter 208 is a binary programmable counter.

Figure 3:
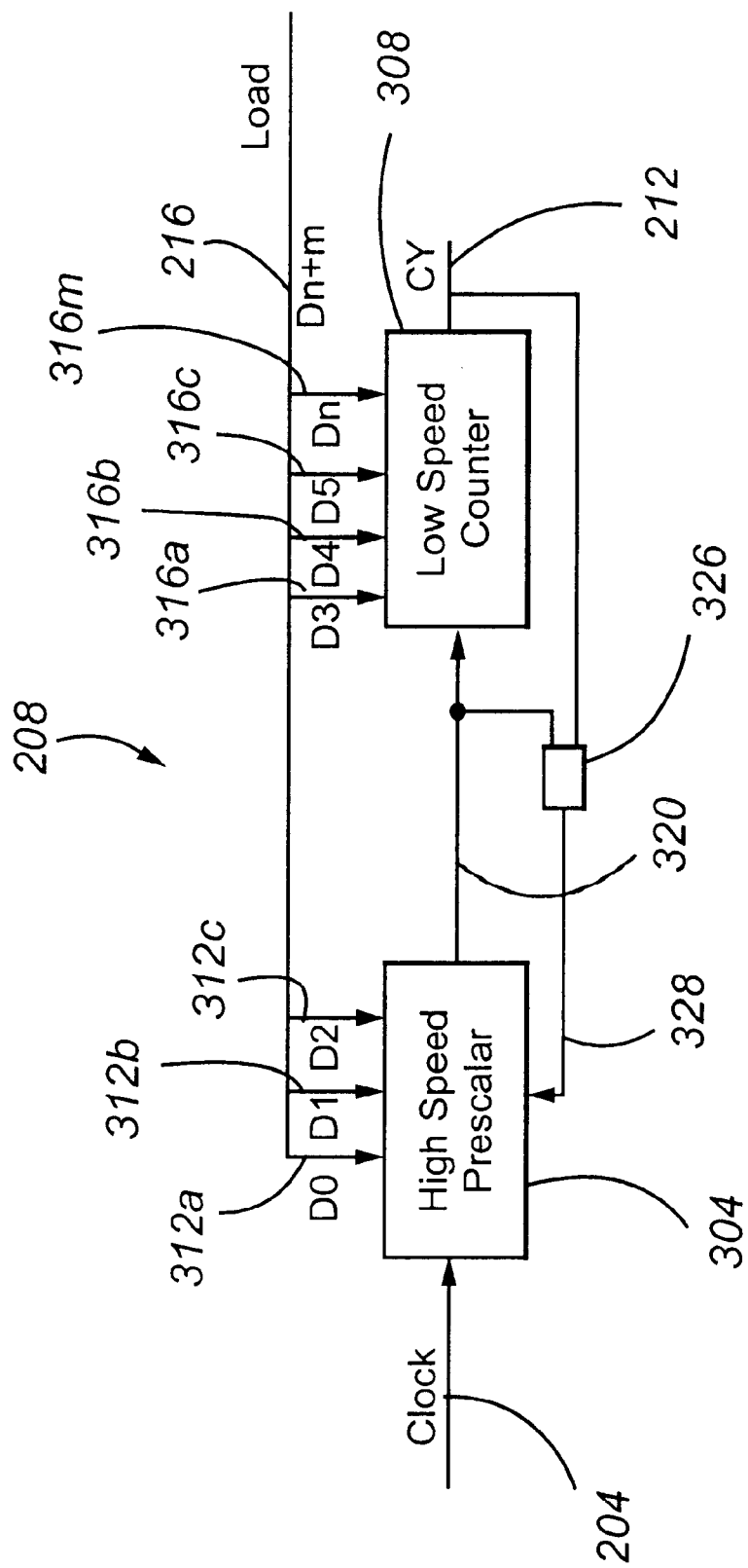
FIG. 3 is a top level block diagram illustrating a high speed programmable counter in accordance with an embodiment of the present invention.

With reference now to FIG. 3, a top level block diagram of a high speed programmable counter 208 in accordance with an embodiment of the present invention is illustrated. The high speed programmable counter 208 generally includes a high speed prescaler 304 and a low speed counter 308. The high speed prescaler 304 receives a clock signal 204 (i.e., a signal comprising the frequency to be divided). The high speed prescaler 304 can generally be described as an n bit prescaler. The low speed counter 308 can generally be described as an m bit counter. The n least significant bits 312 of the modulus of division 216 are provided directly to the high speed prescaler 304. The m most significant bits 316 of the modulus of division 216 are provided directly to the low speed counter 308.

In operation, the high speed prescaler 304 divides the clock signal 204 by a value as small as $2^n$ and as large as $2^n+(2^n-1)$, where n is equal to the number of bits of the high speed prescaler 304 and where n is also equal to the number of least significant bits 312 of the modulus of division 216 provided to the high speed prescaler 304. The high speed prescaler provides a low frequency output or high speed carry 320 to the low speed counter 308. The low speed counter 308 divides the low frequency output 320 by the value indicated by the m most significant bits 316 of the modulus of division. The low speed counter 308 asserts an output signal or low speed carry 212 every r-th cycles of the clock 204, where r is equal to the modulus of division 216. The optional trigger logic 326, having a clock input connected to the high speed carry 320 and a data input connected to the low speed carry 212, provides as a reclocked output a trigger (TR) signal 328 to the high speed prescaler 304 to eliminate metastability. The trigger signal 328 is provided for one period of the high speed carry 320, during one period of the low speed carry. Additional trigger logic may also be provided to allow the programmable counter to divide by values as small as $j*2^n$ where $j=1$.

Figure 4:
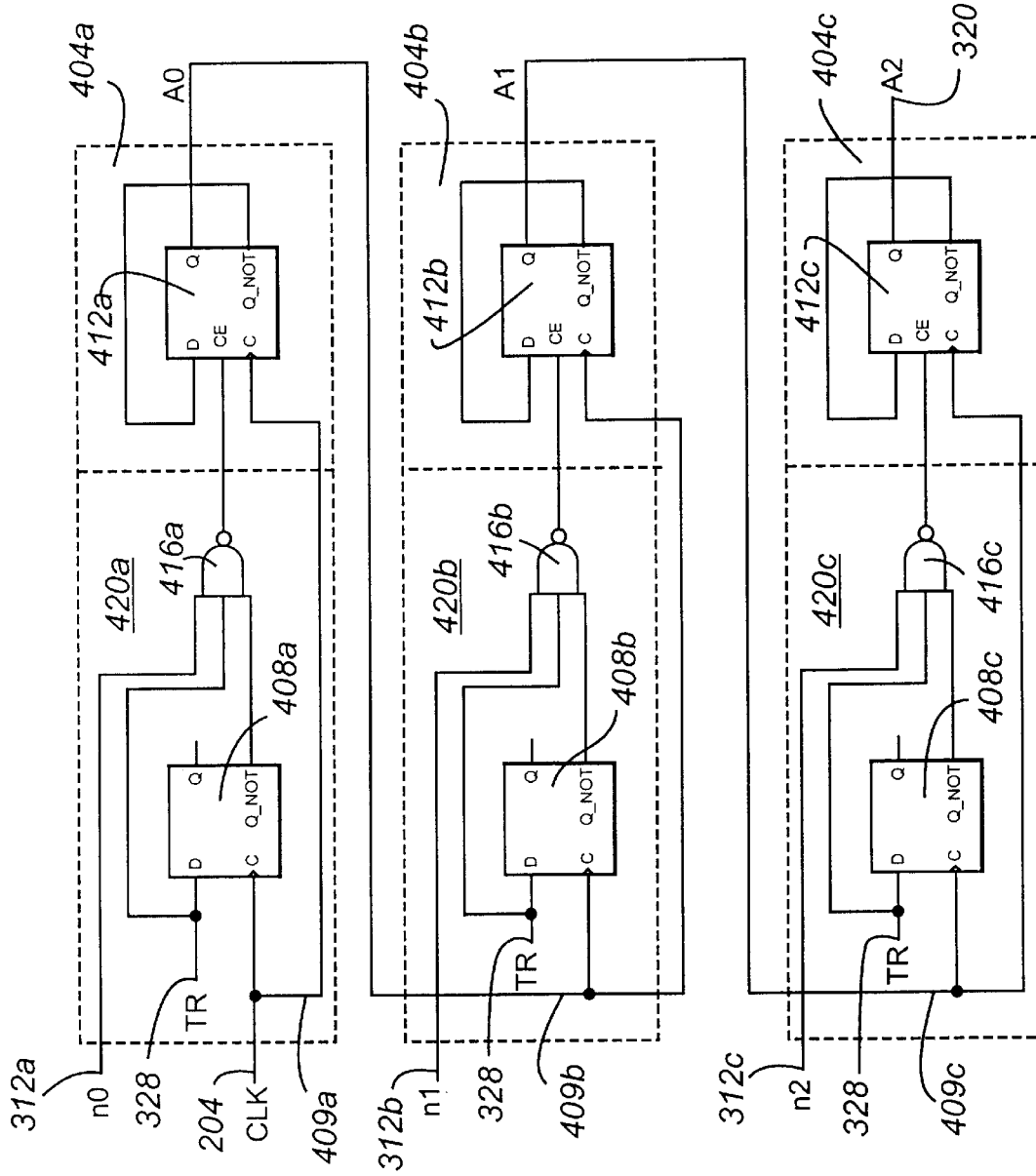
FIG. 4 is a circuit diagram of a high speed prescaler in accordance with an embodiment of the present invention.

With reference now to FIG. 4, a block diagram illustrating the circuit elements of a high speed prescaler 304 in accordance with a modular embodiment of the present invention is illustrated. In particular, the high speed prescaler 304 illustrated in FIG. 4 is an n bit high speed prescaler with n equal to 3. With reference to FIG. 4, it is apparent that each of the n bits of the high speed prescaler 304 is implemented by a separate stage 404. Accordingly, the 3 bit high speed prescaler 304 has three stages 404a, 404b, and 404c. Each stage 404 includes a count skip control D flip-flop 408, and a count D flip-flop 412 having a count enable input EN. In addition, each stage 404 includes a count skip control NAND gate 416.

The count skip control D flip-flop 408 and the NAND gate 416 act as a single-shot 420, triggered by a rising edge on the TR input 328, which is the output 212 of the low speed counter 308 directly or reclocked. The clock input 409 of each stage 404 is the Q output of the previous stage 404, or in the case of the first stage 404a the high speed clock 204. For example, the clock inputs of the count skip control D flip-flop 408b and the count D flip-flop 412b of the second stage 404b are interconnected to the Q output of the count D flip-flop 412a of the first stage 404a. Likewise, the clock inputs of the count skip control D flip-flop 408c and the count D flip-flop 412c of the third stage 404c are interconnected to the Q output of the count D flip-flop 412b of the second stage 404b.

In each stage 404 the TR input 328 is common and is connected to the D input of the count skip control D flip-flop 408 and to one input of the NAND gate 416. The /Q output of the count skip control D flip-flop 408 is connected to a second input of the NAND gate 416. A third input of each NAND gate 416 is connected to the corresponding bit 312 of the input data bus 216.

The clock input 409 of each stage 404 is provided to both flip-flops 408 and 412, and the output of the 416 NAND gate is connected to the +Enable input of the count D flip-flop 412. In each stage, on the rising edge of the trigger TR 328, if the bit 312 is "1" and the /Q output of 408 is also "1", the output of the NAND gate 416 goes low, preventing the count D flip-flop 412 from changing state on the following rising edge of the clock, preserving the previous state of the outputs of the flip-flop 412 until the next clock (i.e. the state of the count D flip-flop 412 is extended by one cycle of the clock of the stage 404).

The first stage 404a can skip one, the second stage 404b two, the third stage 404c four input 204 cycles, etc. Even if the Enable signal from the second stage's 404b single shot 420b overlaps with the Enable signal from the first stage's 404a single shot 420a when the input 312 is 011 or 111, the output of the high speed prescaler is extended by three. Therefore, it can be appreciated that the exact timing of the single-shot 420 outputs is irrelevant to the proper operation of the high speed prescaler 304. If metastability is perceived to be a problem, additional flip-flops can be added at the TR input to each stage 404.

Each NAND gate 416 has an input connected to one of the n least significant bits 312 of the modulus of division 216. In particular, the least significant 312a of the least significant bits 312 is provided to an input of the NAND gate 416a of the first stage 404a, while the second least significant bit 312b is provided to an input of the NAND gate 416b of the second stage 404b, and the most significant of the least significant bits 312c is provided to an input of the NAND gate 416c of the third stage 404c.

The high speed prescaler output 320 may be taken from either the Q or the /Q output of the count D flip-flop 412 of the last stage 404 of the high speed prescaler 304 directly. For example, as shown in FIG. 4, the prescaler output 320 may be taken from the Q output of the count D flip-flop 412c of the third stage 404c. Alternatively, outputs from the count D flip-flops 412 may be fed into logic to assert a signal on the prescaler output 320 when a particular count value is held by the prescaler 304. For example, the Q outputs of the count D flip-flops 412 can be input to a NOR gate to assert a signal on the prescaler output 320 when the prescaler 304 holds a value of 0.

Figure 5:
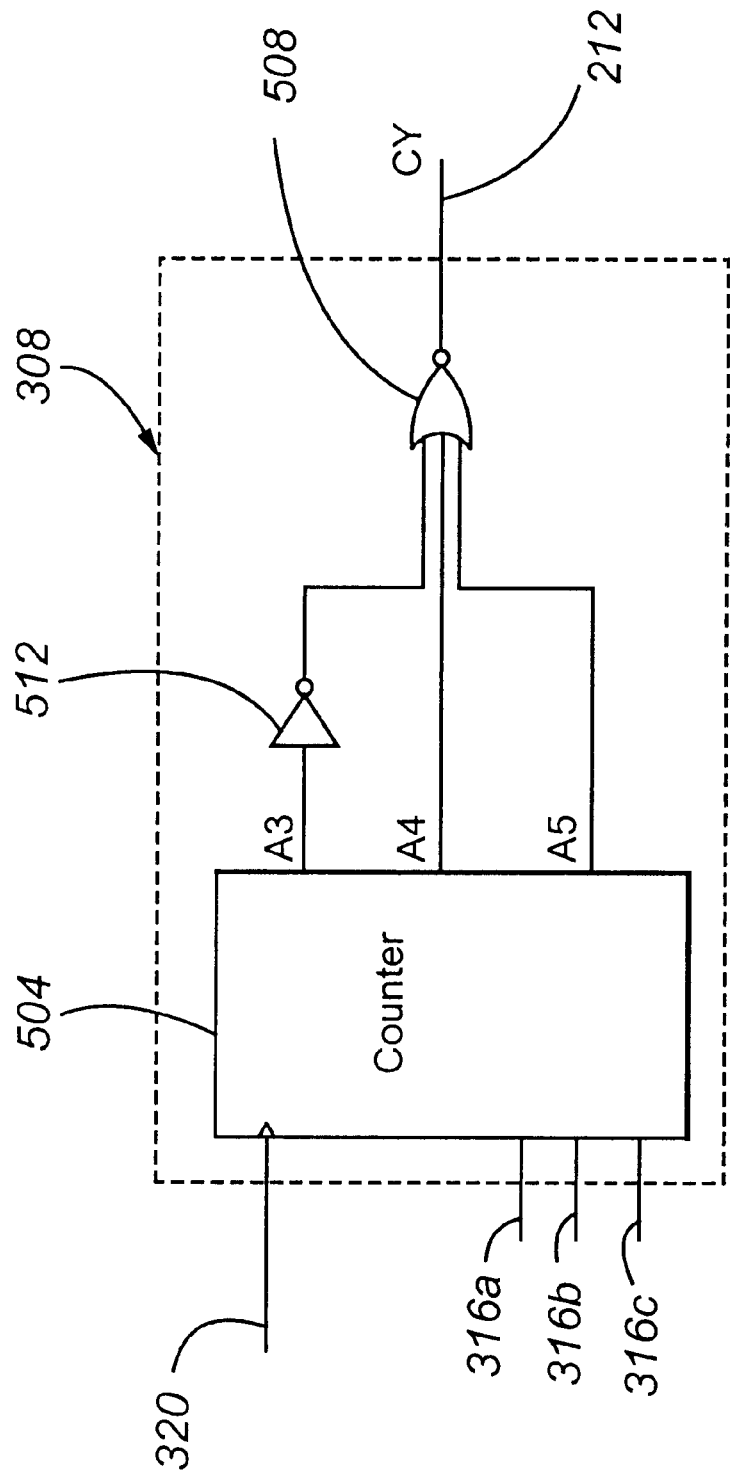
FIG. 5 is a circuit diagram of a low speed counter in accordance with an embodiment of the present invention.

With reference to FIG. 5, a low speed counter 308 in accordance with an embodiment of the present invention is illustrated. In general, the low speed counter 308 includes a programmable counter 504 receiving at its clock input the carry output of the high speed prescaler 320. In addition, the m most significant bits 316 of the modulus of division 216 are loaded into the counter 504 as a start value. The programmable counter 504 counts down from the loaded start value, decrementing the value held by the counter by one for each output pulse 320 received from the high speed prescaler 304.

The outputs of the counter 504 illustrated in FIG. 5 are provided to the inputs of a NOR gate 508. The output of the least significant bit of the counter 504 is inverted by an inverter 512 so that an output signal or low speed carry 212 is asserted when a value of 001 is held by programmable counter 504. The programmable counter 504 can be any counter capable of counting down from a selected value. For example, the programmable counter 504 may be a 74F269 synchronous counter. The inverter 512 eliminates the necessity of subtracting $2^n$ from the modulus of division 216 to ensure that if the counter 504 receives the number m, it will have from m to one input cycles so it will divide by m while going through the sequence starting at m and ending at one.

In operation, the high speed prescaler 304 of the present invention is capable of dividing the clock signal 204 by a value as small as $2^n$ or as large as $2^n+(2^n-1)$. The maximum value by which the high speed prescaler 304 divides the clock signal 204 is determined by the n least significant bits of the modulus 216 of division. The output 320 of the high speed prescaler 304 is then divided by the value represented by the m most significant bits using the low speed counter 308. A high speed programmable counter 208 in accordance with an embodiment of the present invention is capable of dividing a clock signal 204 by any value greater than or equal to $2*2^n$ and less than or equal to $2^{m+n}$. As can be appreciated by one of ordinary skill in the art, with additional trigger logic 326, a high speed programmable counter 208 in accordance with the present invention can divide by any value greater than or equal to $2^n$ and less than or equal to $2^{m+n}$. Such additional trigger logic 326 may comprise an AND gate with the low speed carry 212 and the high speed carry 320 as inputs and the trigger signal 328 as the output.

The operation of a high speed programmable counter 208 in accordance with an embodiment of the present invention will now be explained in the context of an example. According to this example, the modulus of division 216 is equal to 23 (binary 010111). Furthermore, for purposes of the present example, the high speed prescaler 304 is a 3 bit device (i.e., n=3) and the low speed counter 308 is also a 3 bit device (i.e., m=3). In order to configure the high speed counter 208 to divide the input signal 204 by 23, the binary equivalent of the decimal value 23 (i.e. 010111) is asserted on the m+n bit modulus of division 216 bus. The n least significant bits are provided to the high speed prescaler 304. Therefore, according to the present example, the binary value 111 is loaded into the high speed prescaler 304. Further, the m most significant bits, carrying the binary value 010, are loaded into the low speed counter 308.

With reference now to Table 1, the states of the high speed prescaler 304 and the low speed counter 308 are shown while dividing an input signal by 23 in accordance with the embodiment of the present invention illustrated in connection with FIGS. 3, 4 and 5.

TABLE 1

|   | #1 | | | | #2 | | | | #3 | | | | #4 | | | |
|---|---|---|---|---|---|---|---|---|---|---|---|---|---|---|---|---|
|   | Cy | QQQ 543 | Cy | QEQEQE 221100 | Cy | QQQ 543 | Cy | QEQEQE 221100 | Cy | QQQ 543 | Cy | QEQEQE 221100 | Cy | QQQ 543 | Cy | QEQEQE 221100 |
| 1 | 0 | 010 | 0 | 1.1.1. | 0 | 010 | 0 | 1.1.1. | 0 | 010 | 0 | 1.1.1. | 0 | 010 | 0 | 1.1.1. |
| 2 | 0 | 010 | 0 | 1.1.0. | 0 | 010 | 0 | 1.1.0. | 0 | 010 | 0 | 1.1.0. | 0 | 010 | 0 | 1.1.0. |
| 3 | 0 | 010 | 0 | 1.0.1. | 0 | 010 | 0 | 1.0.1. | 0 | 010 | 0 | 1.1.0# | 0 | 010 | 0 | 1.1#1. |
| 4 | 0 | 010 | 0 | 1.0.1# | 0 | 010 | 0 | 1.0.1# | 0 | 010 | 0 | 1.0.1. | 0 | 010 | 0 | 1.1#1# |
| 5 | 0 | 010 | 0 | 1.0.0. | 0 | 010 | 0 | 1.0.0. | 0 | 010 | 0 | 1.0.0. | 0 | 010 | 0 | 1.1.0. |
| 6 | 0 | 010 | 0 | 1.0#1. | 0 | 010 | 0 | 1.0#1. | 0 | 010 | 0 | 1#1.1. | 0 | 010 | 0 | 1.0.1. |
| 7 | 0 | 010 | 0 | 1.0#0. | 0 | 010 | 0 | 1.0#0. | 0 | 010 | 0 | 1#1.0. | 0 | 010 | 0 | 1.0.0. |
| 8 | 0 | 010 | 0 | 1#1.1. | 0 | 010 | 0 | 0.1.1. | 0 | 010 | 0 | 1#0.1. | 0 | 010 | 0 | 0.1.1. |
| 9 | 0 | 010 | 0 | 1#1.0. | 0 | 010 | 0 | 0.1.0. | 0 | 010 | 0 | 1#0.0. | 0 | 010 | 0 | 0.1.0. |
| 10 | 0 | 010 | 0 | 1#0.1. | 0 | 010 | 0 | 0.0.1. | 0 | 010 | 0 | 1.0#1. | 0 | 010 | 0 | 0.0.1. |
| 11 | 0 | 010 | 0 | 1#0.0. | 0 | 010 | 0 | 0.0.0. | 0 | 010 | 0 | 1.0#0. | 0 | 010 | 0 | 0.0.0. |
| 12 | 0 | 010 | 0 | 0.1.1. | 0 | 010 | 0 | 0#1.1. | 0 | 010 | 0 | 0.1.1. | 0 | 010 | 0 | 0#1.1. |
| 13 | 0 | 010 | 0 | 0.1.0. | 0 | 010 | 0 | 0#1.0. | 0 | 010 | 0 | 0.1.0. | 0 | 010 | 0 | 0#1.0. |
| 14 | 0 | 010 | 0 | 0.0.1. | 0 | 010 | 0 | 0#0.1. | 0 | 010 | 0 | 0.0.1. | 0 | 010 | 0 | 0#0.1. |
| 15 | 0 | 010 | 1 | 0.0.0. | 0 | 010 | 1 | 0#0.0. | 0 | 010 | 1 | 0.0.0. | 0 | 010 | 1 | 0#0.0. |
| 16 | 1 | 001 | 0 | 1.1.1. | 1 | 001 | 0 | 1.1.1. | 1 | 001 | 0 | 1.1.1. | 1 | 001 | 0 | 1.1.1. |
| 17 | 1 | 001 | 0 | 1.1.0. | 1 | 001 | 0 | 1.1.0. | 1 | 001 | 0 | 1.1.0. | 1 | 001 | 0 | 1.1.0. |
| 18 | 1 | 001 | 0 | 1.0.1. | 1 | 001 | 0 | 1.0.1. | 1 | 001 | 0 | 1.0.1. | 1 | 001 | 0 | 1.0.1. |
| 19 | 1 | 001 | 0 | 1.0.0. | 1 | 001 | 0 | 1.0.0. | 1 | 001 | 0 | 1.0.0. | 1 | 001 | 0 | 1.0.0. |
| 20 | 1 | 001 | 0 | 0.1.1. | 0 | 001 | 0 | 0.1.1. | 1 | 001 | 0 | 0.1.1. | 1 | 001 | 0 | 0.1.1. |
| 21 | 1 | 001 | 0 | 0.1.0. | 1 | 001 | 0 | 0.1.0. | 1 | 001 | 0 | 0.1.0. | 1 | 001 | 0 | 0.1.0. |
| 22 | 1 | 001 | 0 | 0.0.1. | 1 | 001 | 0 | 0.0.1. | 1 | 001 | 0 | 0.0.1. | 1 | 001 | 0 | 0.0.1. |
| 23 | 1 | 001 | 1 | 0.0.0. | 1 | 001 | 1 | 0.0.0. | 1 | 001 | 1 | 0.0.0. | 1 | 001 | 1 | 0.0.0. |

|   | #5 | | | | #6 | | | | #7 | | | | #8 | | | |
|---|---|---|---|---|---|---|---|---|---|---|---|---|---|---|---|---|
|   | Cy | QQQ 543 | Cy | QEQEQE 221100 | Cy | QQQ 543 | Cy | QEQEQE 221100 | Cy | QQQ 543 | Cy | QEQEQE 221100 | Cy | QQQ 543 | Cy | QEQEQE 221100 |
| 1 | 0 | 010 | 0 | 1.1.1. | 0 | 010 | 0 | 1.1.1. | 0 | 010 | 0 | 1.1.1. | 0 | 010 | 0 | 1.1.1. |
| 2 | 0 | 010 | 0 | 1.1.0. | 0 | 010 | 0 | 1.1.0. | 0 | 010 | 0 | 1.1.0. | 0 | 010 | 0 | 1.1.0. |
| 3 | 0 | 010 | 0 | 1.1.0# | 0 | 010 | 0 | 1.0.1. | 0 | 010 | 0 | 1.1#1. | 0 | 010 | 0 | 1.1.0# |
| 4 | 0 | 010 | 0 | 1.0.1. | 0 | 010 | 0 | 1.0.0. | 0 | 010 | 0 | 1.1#1# | 0 | 010 | 0 | 1.0.1. |
| 5 | 0 | 010 | 0 | 1.0.0. | 0 | 010 | 0 | 1#1.1. | 0 | 010 | 0 | 1.1.0. | 0 | 010 | 0 | 1.0.0. |
| 6 | 0 | 010 | 0 | 1#1.1. | 0 | 010 | 0 | 1#1.1# | 0 | 010 | 0 | 1.0.1. | 0 | 010 | 0 | 1#1.1. |
| 7 | 0 | 010 | 0 | 1#1.0. | 0 | 010 | 0 | 1#1.0. | 0 | 010 | 0 | 1.0.0. | 0 | 010 | 0 | 1#1.0. |
| 8 | 0 | 010 | 0 | 1#1#1. | 0 | 010 | 0 | 1#1#1. | 0 | 010 | 0 | 1#1.1. | 0 | 010 | 0 | 1#1#1. |
| 9 | 0 | 010 | 0 | 1#1#0. | 0 | 010 | 0 | 1.1#0. | 0 | 010 | 0 | 1#1.0. | 0 | 010 | 0 | 1#1#0. |
| 10 | 0 | 010 | 0 | 1.0.1. | 0 | 010 | 0 | 1.0.1. | 0 | 010 | 0 | 1#0.1. | 0 | 010 | 0 | 1.0.1. |
| 11 | 0 | 010 | 0 | 1.0.0. | 0 | 010 | 0 | 1.0.0. | 0 | 010 | 0 | 1#0.0. | 0 | 010 | 0 | 1.0.0. |
| 12 | 0 | 010 | 0 | 0.1.1. | 0 | 010 | 0 | 0.1.1. | 0 | 010 | 0 | 0.1.1. | 0 | 010 | 0 | 0.1.1. |
| 13 | 0 | 010 | 0 | 0.1.0. | 0 | 010 | 0 | 0.1.0. | 0 | 010 | 0 | 0.1.0. | 0 | 010 | 0 | 0.1.0. |
| 14 | 0 | 010 | 0 | 0.0.1. | 0 | 010 | 0 | 0.0.1. | 0 | 010 | 0 | 0.0.1. | 0 | 010 | 0 | 0.0.1. |
| 15 | 0 | 010 | 1 | 0.0.0. | 0 | 010 | 1 | 0.0.0. | 0 | 010 | 1 | 0.0.0. | 0 | 010 | 1 | 0.0.0. |
| 16 | 1 | 001 | 0 | 1.1.1. | 1 | 001 | 0 | 1.1.1. | 1 | 001 | 0 | 1.1.1. | 1 | 001 | 0 | 1.1.1. |
| 17 | 1 | 001 | 0 | 1.1.0. | 1 | 001 | 0 | 1.1.0. | 1 | 001 | 0 | 1.1.0. | 1 | 001 | 0 | 1.1.0. |
| 18 | 1 | 001 | 0 | 1.0.1. | 1 | 001 | 0 | 1.0.1. | 1 | 001 | 0 | 1.0.1. | 1 | 001 | 0 | 1.0.1. |
| 19 | 1 | 001 | 0 | 1.0.0. | 1 | 001 | 0 | 1.0.0. | 1 | 001 | 0 | 1.0.0. | 1 | 001 | 0 | 1.0.0. |
| 20 | 1 | 001 | 0 | 0.1.1. | 1 | 001 | 0 | 0.1.1. | 1 | 001 | 0 | 0.1.1. | 1 | 001 | 0 | 0.1.1. |
| 21 | 1 | 001 | 0 | 0.1.0. | 1 | 001 | 0 | 0.1.0. | 1 | 001 | 0 | 0.1.0. | 1 | 001 | 0 | 0.1.0. |
| 22 | 1 | 001 | 0 | 0.0.1. | 1 | 001 | 0 | 0.0.1. | 1 | 001 | 0 | 0.0.1. | 1 | 001 | 0 | 0.0.1. |
| 23 | 1 | 001 | 1 | 0.0.0. | 1 | 001 | 1 | 0.0.0. | 1 | 001 | 1 | 0.0.0. | 1 | 001 | 1 | 0.0.0. |

Table 1 illustrates the operation of the counter with the modular prescaler. The columns, from right to left, are:

| | |
|---|---|
| E0 | Enable bit 0 - output of 416a |
| Q0 | bit 0 output |
| E1 | Enable bit 1 - output of 416b |
| Q1 | bit 1 output |
| E2 | Enable bit 2 - output of 416c |
| Q2 | bit 2 output |
| CY | Carry of prescaler |
| Q3 | bit 3 output |
| Q4 | bit 4 output |
| Q5 | bit 5 output |
| CY | Carry of low speed counter |

The Enable column has a "#" sign whenever the bit is disabled. The eight illustrated sequences are different due to differing amounts of delays inserted into the Enable lines. However, although the sequences are different, it will be noted that in each sequence, the high speed programmable counter 208 divides by the selected modulus of division 216 (23 in the example of Table 1).

As shown in Table 1, both the high speed prescaler 304 and the low speed counter 308 count down. In particular, the high speed prescaler 304 counts down from a value equal to $2^n-1$, or with respect to the present example $2^3-1=7$. The low speed counter 308 counts down from the value carried by the m most significant bits of the bus carrying the modulus of division 216, and loaded into the low speed counter 308. According to the present example, the value loaded into the low speed counter 308 is binary 010, or decimal 2.

When the first clock pulse of the input signal 204 is received, the high speed prescaler 304 proceeds to count down from 7 (binary 111). According to the present example, upon reaching 0, after the $2^n+N$, where N is the value represented by the n least significant bits of the modulus of division (i.e. the fifteenth in the present example) clock pulse has been received, a high speed carry signal or pulse 320 is sent from the high speed prescaler 304 to the low speed counter 308. In response, the low speed counter 308 counts down from binary 010 (decimal 2) to binary 001 (decimal 1).

With reference to FIG. 5, it can be appreciated that when the counter 504 outputs a value 001, the inverter 512 inverts the output A3, and all of the inputs to the NOR gate 508 are 0. The output signal 212 is therefore asserted when the counter 504 holds a value 001. From the value 001, the low speed counter 308 is reloaded with the value represented by the m most significant bits 316 of the modulus of division 216. Therefore, in the example illustrated in Table 1, the low speed counter goes through the stages 2,1,2,1 . . . etc. The carry 320 may be used as a trigger signal 328 directly, or may be reclocked in a shift register of one or more stages 326.

The high speed prescaler 304 goes through the stages 7 6 5 4 3 2 1 0 continuously and its carry 320 (see FIGS. 4 and 5) clocks the low speed counter 308. After receiving the trigger signal 328, the single-shot 420 in each stage is activated if its input bit 312 is active. For instance, if all of the stages have a corresponding input bit 312 that is high, as in the example of Table 1, the consecutive stages 404 skip 1, 2 and 4 input clock 204 cycles. Since the delay of the clock of the stages 404 may be different, the skipping intervals of the three bits may or may not coincide or overlap, and in fact the point in the count when a stage 404 skips a count may change from cycle to cycle. Nevertheless the high speed prescaler 304 skips the required number of cycles. Therefore, it should be appreciated that the placement of the skipped counts within Table 1 are presented for exemplary purposes only.

The mechanism by which the flipping of a bit within the high speed prescaler 304 is skipped will now be explained in detail in connection with FIG. 4. In general, it can be appreciated that the count D flip-flops 412 implement a ripple counter that counts down. However, whether the count D flip-flop 412 of a stage 404 is enabled is controlled by the count skip control D flip-flop 408 and the NAND gate 416 associated with that stage. In particular, when the trigger signal 328 and the input 312 from the modulus of division 216 are both asserted, a count D flip-flop 412 will not be enabled, and will therefore skip one count. The effect of skipping one count on the high speed carry signal 320 of the high speed prescaler 304 depends on the bit implemented by the stage 404 in which the count is skipped. In general, the number by which input signal 204 is divided when a bit is skipped is increased by $2^{k-1}$, where k is the stage 404 of the high speed prescaler 304. For example, skipping a count in the first stage (404a in FIG. 4) increases the amount by which the input signal 204 is divided by 1. Skipping the second stage (404b in FIG. 4) increases the amount by which the input signal is divided by 2. Skipping the third stage (404c in FIG. 4) increases the amount by which the input signal is divided by 4.

With reference to the first sequence (#1) illustrated in Table 1, it is immediately obvious that the least significant bit (the Q output of 412a) changes in each clock cycle unless its Enable output is low as indicated in state 4. It can be appreciated that each following bit changes state when all lower bits are zero, unless prevented by their Enable input. The Q1 bit, the output of 412b, would normally go high in line 5, but since Q0 was inhibited in line 4, this transition is skipped. In line 6, Enable 1 drops for two clock cycles. This prevents Q1 from changing to low in line 6. In line 7 both bit0 and bit1 are low so bit2 would change if it were not inhibited by the Enable 2 which is low for 4 clock cycles. Due to the action of the three skip control circuits, the normal 7,6,5,4,3,2,1,0 count sequence is modified to a 7,6,5,5,4,5,4,7,6,5,4,3,2,1,0 sequence, which is 1+2+4=7 clock cycles longer.

Figure 6:
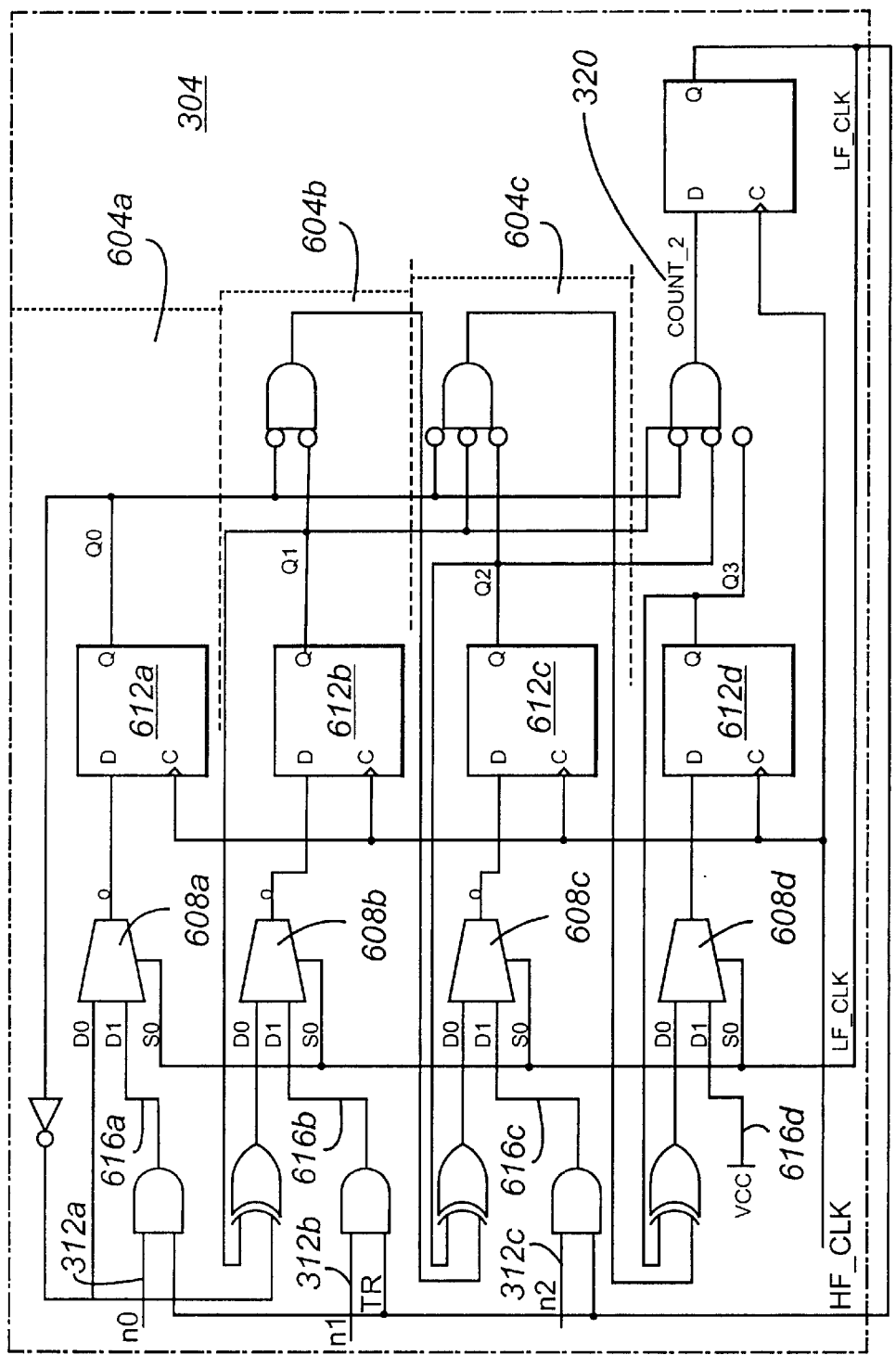
FIG. 6 is a circuit diagram of a high speed prescaler in accordance with another embodiment of the present invention.
Figure 7:
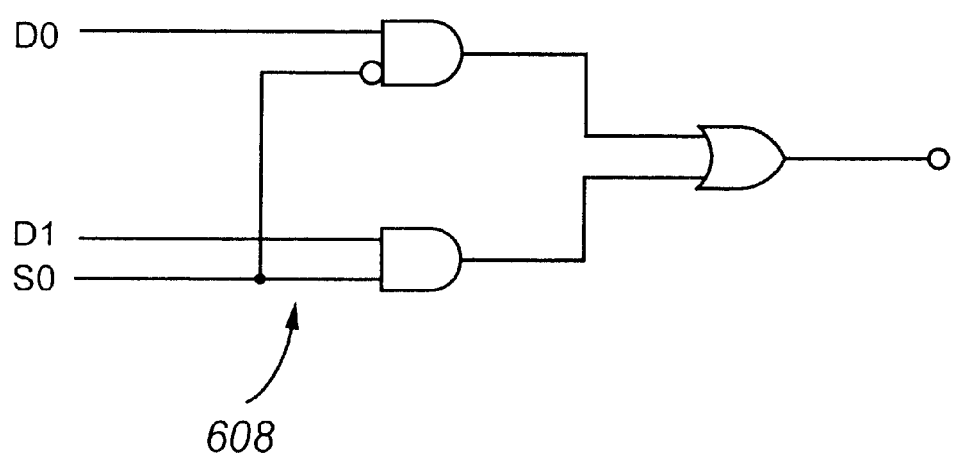
FIG. 7 is a circuit diagram of the functional equivalent of a circuit element in accordance with an embodiment of the present invention.

With reference now to FIG. 6, a high speed prescaler 304 in accordance with another embodiment of the present invention is illustrated. The high speed prescaler 304 illustrated in FIG. 6 is a four-bit programmable down counter, operating at the frequency of the clock input 204. In the embodiment illustrated in FIG. 4, first 604a, second 604b and third 604c bits receive via logic 608 input data 616a–c having a value that is dependent on the corresponding least significant bits 312 of the modulus of division 216 and the TR signal 328. The fourth bit 604d has an input data 616d signal that is tied high permanently. FIG. 7 illustrates the components of logic 608.

The CARRY 320 (LF_CLK) is generated when the counter is in the state of 0001. Therefore, if the value represented by the n lowest bits 312 is N the counter will go through 8+N cycles. If N=0 then the sequence is 8,7,6,5,4, 3,2,1. If N>0 the sequence is extended on the left side with N counts so the sequence begins with 8+N .

Figure 8:
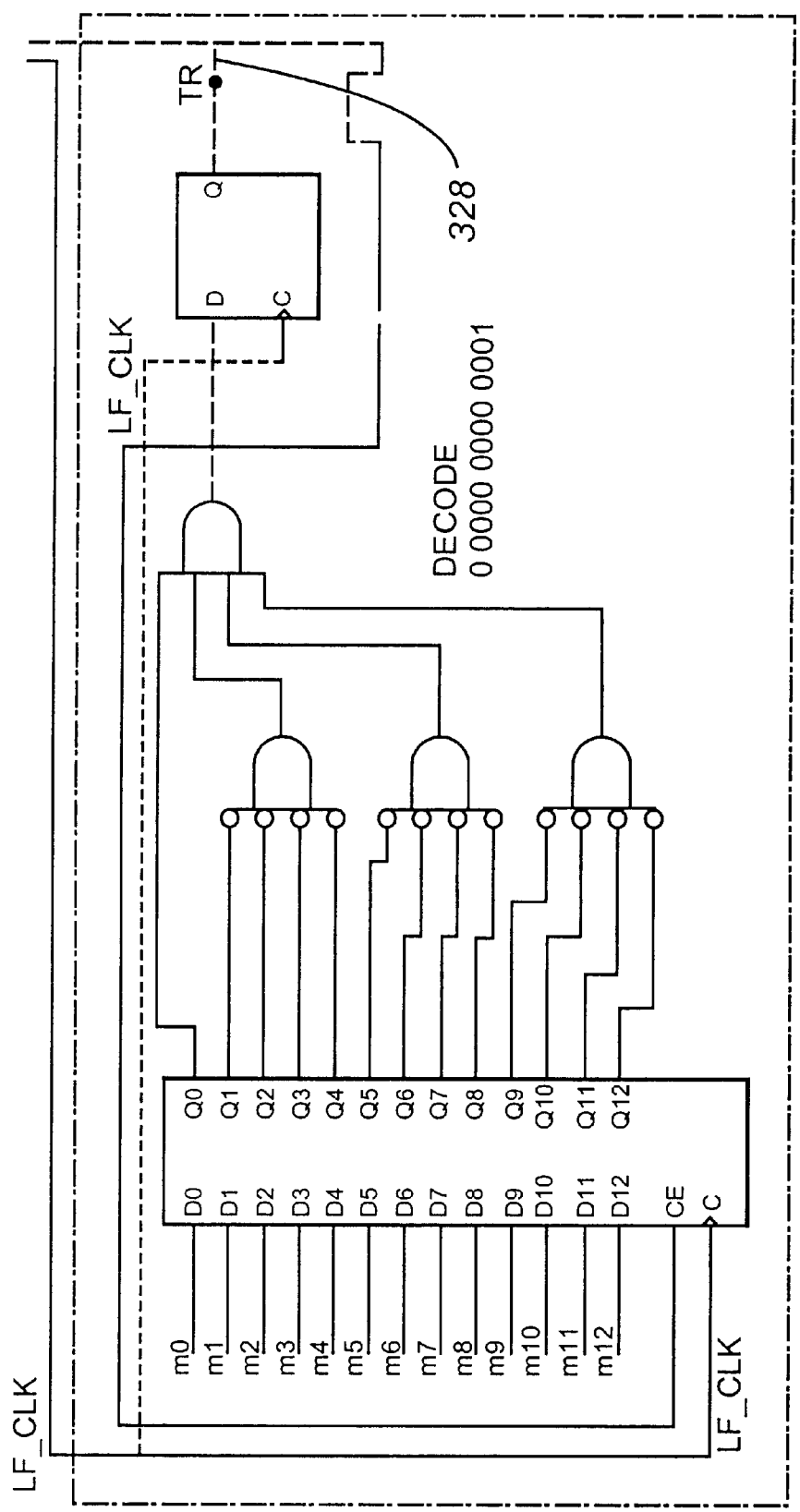
FIG. 8 is a circuit diagram of a low speed counter in accordance with another embodiment of the present invention.

With reference now to FIG. 8, a low speed counter 308 suitable for use in connection with the high speed prescaler 304 illustrated in connection with FIG. 6 is shown. The low speed counter 308 includes a 13-bit synchronous programmable down counter 804. Counter logic 808 generates a trigger signal 328 when the counter is in state 0 0000 0000 0001. The trigger signal 328 is generated for one period of the clock signal 320 from the high speed prescaler 304. The trigger signal 328 and the output signal 212 may be taken from the output of the programmable down counter 804. The programmable down counter 804 can be loaded with any number greater than or equal to 2. The high speed programmable counter illustrated in connection with FIGS. 6, 7 and 8 is capable of dividing by any number greater than 15. In comparison, a conventional counter utilizing an 8/9 prescaler is incapable of dividing by any arbitrary number smaller than 56.

For example, Assuming we divide by 23 (binary 10111), the high speed prescaler 304 will normally divide by 8 except once, following the TR signal, at which time it will divide by 8+7=15. The low speed counter 308 will count down from binary 10 (decimal 2) to 01. During one period of the low speed counter 308 (804 in FIG. 8) the high speed prescaler 304 will count down once from 8 to 1 and once, following the TR signal, from 15 to 1, so that the period of the low speed counter will be 15+8=23 input clock long.

In the embodiments set forth above, various circuits for implementing the invention have been discussed. However, the present invention is not so limited. For example, and as can be appreciated by one skilled in the art, various alternative arrangements can be utilized to achieve a programmable counter 208 in accordance with the present invention. Such alternatives are considered to be within the scope of the present invention.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best mode presently known of practicing the invention and to enable others skilled in the art to utilize the invention in such or in other embodiments and with various modifications required by their particular application or use of the invention. It is intended that the appended claims be construed to include the alternative embodiments to the extent permitted by the prior art.

What is claimed is:

1. A programmable composite counter, comprising:
   a multiple bit data bus, wherein said data bus carries a signal comprising m most significant bits and n least significant bits of an m+n bit modulus;
   an n-bit programmable high speed prescaler, comprising:
      a clock signal input;
      a trigger signal input;
      n prescaler inputs interconnected to said n least significant bits of said multiple bit data bus;
      a low frequency output;
   an m-bit programmable low speed counter, comprising:
      a signal input, wherein said signal input is interconnected to said low frequency output of said high speed prescaler;
      m start value inputs interconnected to said m most significant bits of said multiple bit data bus; and
      an output, wherein a frequency of an output signal from said output of said programmable low speed counter is equal to a frequency of a signal provided to said clock signal input of said high speed prescaler divided by said modulus, wherein a minimum value of said modulus is $2^n$.

2. The programmable composite counter of claim 1, wherein said modulus defined in binary code by said data bus is at least $2*2^n$ and is no greater than $2^{m+n}$.

3. The programmable composite counter of claim 1, wherein a minimum value of said modulus defined in binary code by said data bus is less than $2^n*(2^n-1)$.

4. The programmable composite counter of claim 1, wherein said n least significant bits encodes a value j, and wherein said n-bit programmable high speed prescaler is disabled for j cycles of said signal input after activation of said trigger signal.

5. The programmable composite counter of claim 1, wherein said n least significant bits encode a value j, and wherein said n-bit programmable high speed prescaler divides said signal input by a value less than or equal to $2^n+j$.

6. The programmable composite counter of claim 1, wherein a maximum value of said modulus is equal to $2^{m+n}$.

7. A method of frequency dividing a clock signal, comprising:
   providing a count modulus;
   providing an m bit low speed counter;
   providing a clock signal to be divided by said count modulus;
   providing m most significant bits of said count modulus to said m bit low speed counter;
   providing a programmable n bit high speed prescaler;
   providing n least significant bits of said count modulus to said high speed prescaler;
   providing an output of said high speed prescaler as an input to said low speed counter; and
   interconnecting a carry bit output of said low speed counter to said high speed prescaler, wherein activating said carry bit output of said low speed counter extends a cycle of said high speed counter from $2^n$ to $2^n+N$, where N is a value encoded by the n least significant bits of said count modulus.

8. The method of claim 7, wherein said output of said high speed prescaler is a carry output.

9. The method of claim 7, wherein said count modulus encoded by said m plus n bits is equal to the ratio of an input frequency of said clock signal to an output frequency of said low speed counter.

10. The method of claim 7, wherein said clock signal is divided by a count modulus that is less than $2^n*(2^n-1)$.

11. The method of claim 7, wherein said clock signal is divided by a count modulus that is equal to at least $2^n$ and no greater than $2^{m+n}$.

12. The method of claim 7, wherein a duration of one cycle of said low speed counter equals a duration of N of said input clock signal cycles, where N is the number represented by said n+m bit data bus input.

13. A method of frequency dividing an input signal, comprising:
   receiving a modulus to divide by, wherein said modulus to divide by is encoded by m+n bits;
   receiving an input signal; and
   generating an output signal, wherein said output signal has a frequency equal to a frequency of said input signal divided by said modulus, wherein said modulus has any value within a range from $2^n$ to $2^{m+n}$.

14. The method of claim 13, further comprising:
   providing n bits of said modulus to an n bit high speed prescaler, wherein a bit of said high speed prescaler corresponding to a high bit included in said n bits of said modulus is not flipped once per period of said periodic output signal.

15. The method of claim 13, further comprising:
   providing n bits of said modulus to an n bit high speed prescaler, wherein an output cycle of said high speed prescaler is extended by a number represented by said n bits of said modulus.

16. A frequency divider, comprising:
   a multiple bit data bus for carrying a signal representing a modulus of said frequency divider, wherein said multiple bit data bus comprises n+m bits;
   an n-bit prescaler comprising at least n inputs interconnected to said multiple bit data bus to receive n bits from said multiple bit data bus, wherein an output cycle of said prescaler can be selectively extended by from 0 to $2^n-1$ counts according to a value represented by said n bits.

17. The frequency divider of claim 16, further comprising a low speed counter, comprising m start value inputs, wherein said n bits of said multiple bit data bus comprise least significant bits, wherein said multiple bit data bus further comprises m most significant bits interconnected to said m start value inputs, and wherein said frequency divider can divide by any value between $2^n$ and $2^{m+n}$.

* * * * *